US010727434B2

(12) United States Patent
Kwon et al.

(10) Patent No.: US 10,727,434 B2
(45) Date of Patent: Jul. 28, 2020

(54) DISPLAY DEVICE WITH STRUCTURE FOR PREVENTING ORGANIC MATERIAL OVERFLOW

(71) Applicant: SAMSUNG DISPLAY CO., LTD., Yongin-si, Gyeonggi-Do (KR)

(72) Inventors: Oh June Kwon, Yongin-si (KR); Il Sang Lee, Yongin-si (KR); Doo Hwan Kim, Yongin-si (KR); Woo Yong Sung, Yongin-si (KR); Min Sang Kim, Yongin-si (KR); Jin Hwan Jeon, Yongin-si (KR); Seung Yong Song, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/461,107

(22) Filed: Mar. 16, 2017

(65) Prior Publication Data

US 2018/0026225 A1 Jan. 25, 2018

(30) Foreign Application Priority Data

Jul. 25, 2016 (KR) ........................ 10-2016-0094358

(51) Int. Cl.
*H01L 29/08* (2006.01)
*H01L 35/24* (2006.01)
*H01L 51/00* (2006.01)
*H01L 51/52* (2006.01)
*H01L 27/32* (2006.01)

(52) U.S. Cl.
CPC ...... *H01L 51/5237* (2013.01); *H01L 51/5253* (2013.01); *H01L 27/3246* (2013.01); *H01L 27/3258* (2013.01); *H01L 2227/323* (2013.01)

(58) Field of Classification Search
CPC ............. H01L 51/5237; H01L 51/5253; H01L 2227/323; H01L 27/3246; H01L 27/3258
See application file for complete search history.

(56) References Cited

U.S. PATENT DOCUMENTS

| 9,287,523 | B2 | 3/2016 | Yun et al. |
| 9,356,256 | B2 | 5/2016 | Choi |
| 9,885,922 | B2* | 2/2018 | Song ..................... G02F 1/1337 |
| 2004/0095060 | A1* | 5/2004 | Ushifusa .................. H01J 1/70 |
| | | | 313/495 |
| 2005/0285522 | A1* | 12/2005 | Han ....................... H05B 33/04 |
| | | | 313/512 |

(Continued)

FOREIGN PATENT DOCUMENTS

| KR | 10-2013-0100541 | 9/2013 |
| KR | 10-2014-0102073 | 8/2014 |

(Continued)

*Primary Examiner* — Ismail A Muse
(74) *Attorney, Agent, or Firm* — F. Chau & Associates, LLC

(57) ABSTRACT

A display device includes a substrate having a display area, in which an image is displayed, and a non-display area, in which no image is displayed. The non-display area is disposed on at least one side of the display area. A plurality of pixels is disposed in the display area. An encapsulation layer is disposed on the plurality of pixels. A dam unit is disposed in the non-display area. The dam unit includes a body part and a plurality of protrusions. Each of the plurality of protrusions protrudes from the body part.

20 Claims, 14 Drawing Sheets

(56) References Cited

U.S. PATENT DOCUMENTS

| | | | | |
|---|---|---|---|---|
| 2011/0221334 A1* | 9/2011 | Kwon | | H01L 27/3246 313/504 |
| 2012/0049206 A1* | 3/2012 | Choi | | H01L 27/326 257/88 |
| 2012/0224342 A1* | 9/2012 | Kim | | B32B 37/185 361/760 |
| 2012/0319123 A1* | 12/2012 | Han | | H01L 51/5246 257/72 |
| 2012/0319574 A1* | 12/2012 | Kim | | H01L 51/5246 313/512 |
| 2014/0340348 A1* | 11/2014 | Park | | G06F 3/044 345/174 |
| 2015/0060806 A1* | 3/2015 | Park | | H01L 51/5253 257/40 |
| 2015/0064826 A1* | 3/2015 | Jo | | H01L 27/1218 438/34 |
| 2015/0144911 A1* | 5/2015 | Pang | | H01L 51/5246 257/40 |
| 2015/0171367 A1* | 6/2015 | Moon | | H01L 51/5253 257/40 |
| 2015/0357396 A1* | 12/2015 | Han | | H01L 27/32 257/40 |
| 2015/0380685 A1* | 12/2015 | Lee | | H01L 51/5243 257/40 |
| 2016/0035274 A1* | 2/2016 | Kwon | | H01L 27/124 345/206 |
| 2016/0043346 A1* | 2/2016 | Kamiya | | H01L 51/5253 257/40 |
| 2016/0268356 A1* | 9/2016 | Go | | H01L 27/3248 |
| 2016/0284774 A1* | 9/2016 | Zhang | | H01L 21/77 |
| 2016/0285045 A1* | 9/2016 | Park | | H01L 51/5253 |
| 2017/0123244 A1* | 5/2017 | Oh | | G02F 1/133345 |
| 2018/0102502 A1* | 4/2018 | Kim | | H01L 22/12 |

FOREIGN PATENT DOCUMENTS

| | | |
|---|---|---|
| KR | 10-2015-0016053 | 2/2015 |
| KR | 10-2015-0071538 | 6/2015 |

* cited by examiner

DISPLAY DEVICE WITH STRUCTURE FOR PREVENTING ORGANIC MATERIAL OVERFLOW

CROSS-REFERENCE TO RELATED APPLICATION

This application claims priority to and the benefit of Korean Patent Application No. 10-2016-0094358, filed on Jul. 25, 2016, in the Korean Intellectual Property Office, the entire contents of which are herein incorporated by reference in their entirety.

TECHNICAL FIELD

The present disclosure relates to a display device, and more specifically, to a display device with a structure for preventing an organic material from overflowing past a non-display area of a substrate of the display device.

DISCUSSION OF THE RELATED ART

Display devices, such as a liquid crystal display (LCD) device, a plasma display panel (PDP) device, an electrophoretic display device (e.g. e-ink), and an organic light emitting display (OLED) device, are widely used in electronic devices.

For example, the organic light emitting display (OLED) device displays an image by using organic light emitting devices (OLEDs) that are self-emitting so that no backlight is needed. In the organic light emitting display (OLED) device, a non-display area of a substrate of the display device may become deformed, and other defects may be generated, as a result of a liquid organic material, used as an encapsulation layer for the OLEDs that are disposed within a display area of the substrate, overflowing into the non-display area of the substrate during a manufacturing process.

SUMMARY

A display device includes a substrate having a display area, in which an image is displayed, and a non-display area, in which no image is displayed. The non-display area is disposed on at least one side of the display area. A plurality of pixels is disposed in the display area. An encapsulation layer is disposed on the plurality of pixels. A dam unit is disposed in the non-display area. The dam unit includes a body part and a plurality of protrusions. Each of the plurality of protrusions protrudes from the body part.

A display device includes a substrate having a display area, in which an image is displayed, and a non-display area, in which no image is displayed. The non-display area is disposed on at least one side of the display area. A plurality of pixels is disposed in the display area. An encapsulation layer is disposed on the plurality of pixels. A dam unit is disposed in the non-display area. A reinforcing member includes a main body and a plurality of branches. Each of the plurality of branches protrudes from the main body.

A display device includes a substrate having a display area, in which an image is displayed, and a non-display area, in which no image is displayed. The non-display area is disposed on at least one side of the display area. A plurality of pixels is disposed in the display area. An encapsulation layer is disposed on the plurality of pixels. A dam unit is disposed in the non-display area. The dam unit includes a body part and a plurality of protrusions. Each of the plurality of protrusions protrudes from the body part. A reinforcing member is disposed in the non-display area surrounding a side of the dam unit. The reinforcing member includes a main body and a plurality of branches. Each of the plurality of branches protrudes from the main body.

A display device includes a substrate having a display are and a non-display area abutting the display area. A plurality of pixels is disposed exclusively within the display area. Each of the plurality of pixels includes an organic light emitting diode (OLED). An encapsulation layer, including an organic material, is disposed on the plurality of pixels. A baffle is disposed in the non-display area of the substrate and is configured to obstruct a flow of the organic material of the encapsulation layer.

BRIEF DESCRIPTION OF THE DRAWINGS

A more complete appreciation of the present disclosure and many of the attentant aspects thereof will be readily obtained as the same becomes better understood by reference to the following detailed description when considered in connection with the accompanying drawings, wherein.

DETAILED DESCRIPTION OF THE INVENTION

Figure 1:
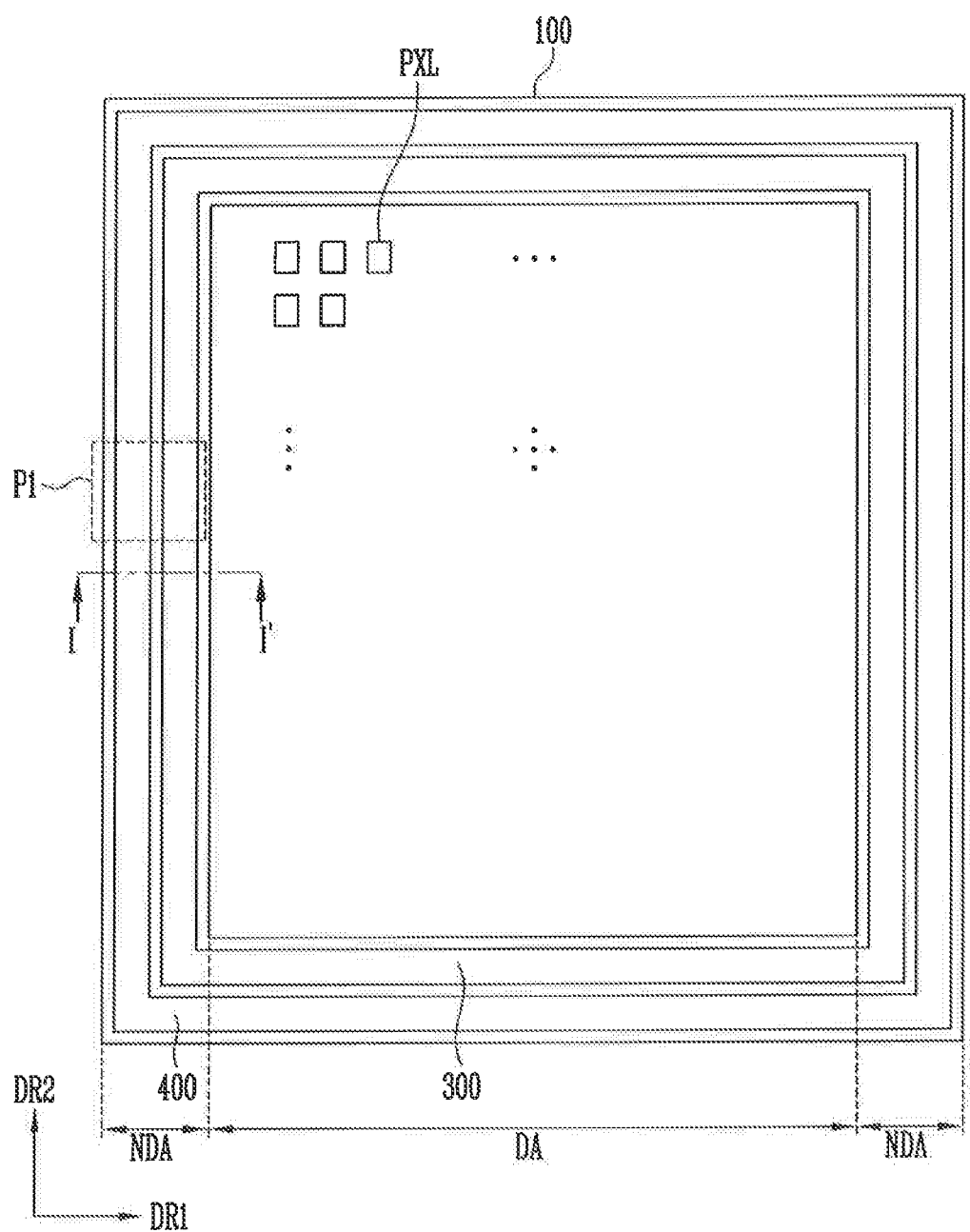
FIG. 1 is a top plan view illustrating a display device according to an exemplary embodiment of the present disclosure.

In describing exemplary embodiments of the present disclosure illustrated in the drawings, specific terminology is employed for the sake of clarity. However, the present disclosure is not intended to be limited to the specific terminology so selected, and it is to be understood that each specific element includes all technical equivalents which operate in a similar manner.

In the description of respective drawings, similar reference numerals may designate similar elements. In the accompanying drawings, sizes and shapes of structures may be exaggerated for clarity. It will be understood that when an element such as a layer, film, region, or substrate is referred to as being on another element, it can be directly on the other element or one or more intervening elements may also be present.

Hereinafter, a display device according to an exemplary embodiment of the present disclosure will be described with reference to the drawings.

Figure 2:
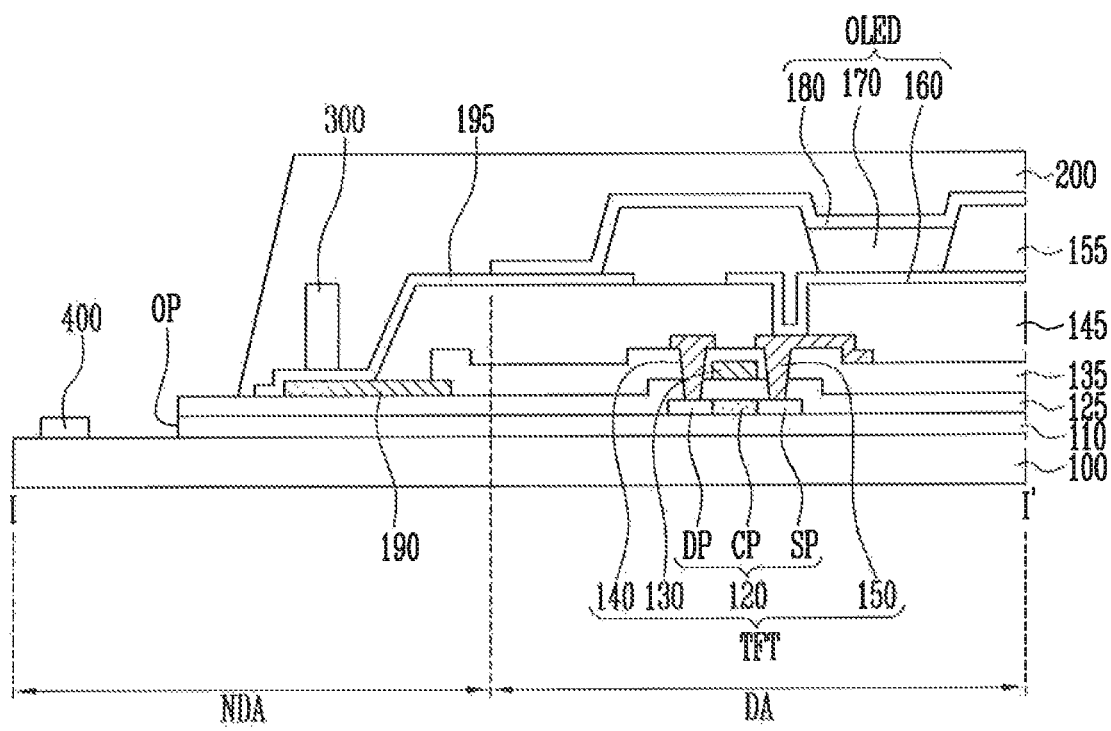
FIG. 2 is a cross-sectional view taken along line I-I' of FIG. 1.

FIG. 1 is a top plan view illustrating a display device according to an exemplary embodiment of the present disclosure, and FIG. 2 is a cross-sectional view taken along line I-I' of FIG. 1.

Referring to FIGS. 1 and 2, a display device according to an exemplary embodiment of the present disclosure includes a substrate 100, a plurality of pixels PXL disposed on the substrate 100, an encapsulation layer 200 disposed on the plurality of pixels PXL, a dam unit 300 disposed on the substrate 100, and a reinforcing member 400 surrounding the dam unit 300.

The substrate 100 includes a display area DA, and a non-display area NDA disposed on at least one side of the display area DA.

The display area DA is an area which includes the plurality of pixels PXL and displays an image. The image may include predetermined visual information, for example, a text, a video, a picture, and a 2D or 3D image.

The non-display area NDA is an area in which the pixels PXL are not disposed, and an image is not displayed. A driving unit 190 driving the pixels PXL may be disposed in the non-display area NDA.

The substrate 100 may have an approximate rectangular shape, but is not limited thereto. According to an exemplary embodiment of the present disclosure, the substrate 100 may include a pair of short sides which are parallel to each other in a first direction DR1, and a pair of long sides which are parallel to each other in a second direction DR2. However, the shape of the substrate 100 is not limited thereto, and the substrate may have various shapes. For example, the substrate 100 may be a polygon having a closed shape including a straight side, a circle or an ellipse including a curved side, or a semicircle or a half ellipse including one side formed of a straight line and anther side formed of a curved line.

The substrate 100 may be formed of a flexible insulating material. The substrate 100 may be formed of various materials, such as glass or polymer metal. The substrate 100 may be, for example, an insulating substrate formed of a polymer organic material. For example, the insulating substrate may include polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and/or cellulose acetate propionate. However, the material of the substrate 100 is not limited thereto, and the substrate 100 may be formed of, for example, Fiber glass Reinforced Plastic (FRP).

The plurality of pixels PXL may be organic light emitting devices including light emitting, but are not limited thereto, and may be implemented in various forms, such as liquid crystal devices, electrophoretic devices, electrowetting devices. The plurality of pixels PXL is disposed on the display area DA of the substrate 100. Each pixel PXL is a smallest unit for displaying an image. Each pixel PXL may include an organic light emitting device emitting white light and/or color light. Each pixel PXL may emit red, green, or blue, but other options are available. For example, each pixel PXL may emit a color, such as cyan, magenta, and yellow. Each pixel PXL includes a thin film transistor TFT connected to a wiring unit, and an organic light emitting diode OLED connected to the thin film transistor TFT. The TFT may be an NMOS transistor.

The dam unit 300 surrounds a border of the display area DA, and the dam unit is disposed within the non-display area NDA of the substrate 100. The dam unit 300 prevents the organic material from overflowing past the non-display area NDA by controlling a flow speed of the organic material included in the encapsulation layer 200.

The reinforcing member 400 surrounds a border of the dam unit 300, and is disposed within the non-display area NDA of the substrate 100. When an impact is applied to the substrate 100, the reinforcing member 400 prevents any crack that may have been formed by the impact from progressing to the display area DA of the substrate 100.

Detailed descriptions of the dam unit 300 and the reinforcing member 400 will be described below with reference to FIG. 3.

Hereinafter, the display device according to an exemplary embodiment of the present disclosure will be described. The display device may utilize a lamination sequence in the display area DA.

The substrate 100 may be formed of an insulating material, such as glass or resin. The substrate 100 may be formed of a flexible material so as to be bendable or foldable, and the substrate 100 may have a single-layer structure or a multi-layer structure.

A buffer layer 110 is disposed on the substrate 100. The buffer layer 100 may prevent impurities from being diffused from the substrate 100, and may increase the flatness of the substrate 100 (e.g. provide planarization). The buffer layer 110 may include only a single layer, but may also include multiple layers.

The buffer layer 110 may be an inorganic insulating layer formed of an inorganic material. For example, the buffer layer 110 may be formed of a silicon nitride, a silicon oxide, a silicon oxynitride, or the like. When the buffer layer 110 includes multiple layers, the respective layers may be formed of the same material, or may be formed of different materials. The buffer layer 110 may also be omitted.

An active pattern 120 is disposed on the buffer layer 110. The active pattern 120 is formed of a semiconductor material. The active pattern 120 may include a source region SP, a drain region DP, and a channel region CP that is disposed between the source region SP and the drain region DP. The active pattern 120 may be a semiconductor pattern formed of polysilicon, amorphous silicon, an oxide semiconductor, and an organic semiconductor material. Here, when the active pattern 120 is formed of the oxide semiconductor, the oxide semiconductor may include an amorphous oxide semiconductor or a crystalline oxide semiconductor. The channel region CP, which is a semiconductor pattern in which impurities are not doped, may be an intrinsic semiconductor. The source region SP and the drain region DP may be semiconductor patterns doped with impurities. Impurities, such as n-type impurities, p-type impurities, and/or other metal dopants, may be used as the impurities.

A gate insulating layer 125 is disposed on the active pattern 120. The gate insulating layer 125 may be an inorganic insulating layer formed of an inorganic material. The inorganic material may include an inorganic insulating material, such as a silicon nitride, a silicon oxide, and/or a silicon oxynitride.

A gate electrode 130 is disposed on the gate insulating layer 125. The gate electrode 130 may cover a region corresponding to the channel region CP of the active pattern 120. The gate electrode 130 may include gold (Au), silver (Ag), aluminum (Al), molybdenum (Mo), chromium (Cr), titanium (Ti), nickel (Ni), neodymium (Nd), and/or copper (Cu), or an alloy of these metals. Further, the gate electrode 130 may include only a single layer and the gate electrode 130 may include multiple layers, in which two or more of the above-mentioned materials are laminated.

An interlayer insulating layer 135 covering the gate electrode 130 is disposed on the gate electrode 130. The interlayer insulating layer 135 may be an inorganic insulating layer formed of an inorganic material. The inorganic material may include a silicon nitride, a silicon oxide, and/or a silicon oxynitride.

Openings passing through the gate insulating layer 125 and the interlayer insulating layer 135 expose the source region SP and the drain region DP of the active pattern 120.

A drain electrode 140 and a source electrode 150 are disposed on the interlayer insulating layer 135. The drain electrode 140 and the source electrode 150 are electrically connected to the drain region DP and the source region SP by the openings formed in the gate insulating layer 125 and the interlayer insulating layer 135, respectively. The drain electrode 140 and the source electrode 150 may each include a metal. For example, the drain electrode 140 and the source electrode 150 may each include gold (Au), silver (Ag), aluminum (Al), molybdenum (Mo), chromium (Cr), nickel (Ni), neodymium (Nd), and/or copper (Cu), and/or an alloy of the metals. Further, the drain electrode 140 and the source electrode 150 may each include only a single layer. Alternatively, the drain electrode 140 and the source electrode 150 may each include multiple layers, in which two or more materials among the metals and the alloys are laminated.

Here, the active pattern 120, the gate electrode 130, the drain electrode 140, and the source electrode 150 together form the thin film transistor TFT. A structure of the thin film transistor TFT is not limited to the particular arrangement described herein, and various other forms or structures of the thin film transistor may be used. For example, the thin film transistor TFT may be disposed in a top gate structure, but may also be disposed in a bottom gate structure, in which the gate electrode 130 is disposed in a lower portion of the active pattern 120.

A passivation layer 145 is formed on the drain electrode 140 and the source electrode 150. The passivation layer 145 may cover the thin film transistor and may include one or more layers. Further, the passivation layer 145 may provide a planarized surface by easing a curve of a lower structure. The passivation layer 145 includes a contact hole exposing a part of the source electrode 150. The passivation layer 145 may be an organic insulating layer formed of an organic material. The organic material may include an organic insulating material, such as a polyacrylic compound, a polyimide compound, a fluorinate carbon compound, such as Teflon, and/or a benzocyclobutene compound.

The organic light emitting diode OLED is disposed on the passivation layer 145. The organic light emitting diode OLED includes a first electrode 160, electrically connected to the source electrode 150, a light emitting layer 170, disposed on the first electrode 160, and a second electrode 180 disposed on the light emitting layer 170.

Either the first electrode 160 or the second electrode 180 may be an anode electrode and the other may be a cathode electrode. For example, the first electrode 160 may be an anode electrode, and the second electrode 180 may be a cathode electrode.

Further, the first electrode 160 and/or the second electrode 180 may be a transmissive electrode. For example, when the organic light emitting diode OLED is a bottom emission type organic light emitting device, the first electrode 160 may be a transmissive electrode, and the second electrode 180 may be a reflective electrode. When the organic light emitting diode OLED is a top emission type organic light emitting device, the first electrode 160 may be a reflective electrode, and the second electrode 180 may be a transmissive electrode. When the organic light emitting diode OLED is a dual emission type organic light emitting device, both the first electrode 160 and the second electrode 180 may be transmissive electrodes. According to an exemplary embodiment of the present disclosure, the first electrode 160 is an anode electrode, and the organic light emitting diode OLED is a top emission organic light emitting device.

The first electrode 160 may be disposed on the passivation layer 145. The first electrode 160 may include a reflective layer, which is capable of reflecting light, and transparent conductive layers disposed in an upper portion and a lower portion of the reflective layer. Either the reflective layer or the transparent conductive layer may be electrically connected to the source electrode 150 through the contact hole of the passivation layer 145.

The reflective layer may include a material, which is capable of reflecting light. For example, the reflective layer may include aluminum (Al), silver (Ag), chromium (Cr), molybdenum (Mo), platinum (Pt), nickel (Ni), and/or an alloy thereof.

The transparent conductive layer may include a transparent conductive oxide. For example, the transparent conductive layer may include an indium tin oxide (ITO), an indium zinc oxide (IZO), an aluminum zinc oxide (AZO), a gallium doped zinc oxide (GZO), a zinc tin oxide (ZTO), a Gallium tin oxide (GTO), and/or a fluorine doped tin oxide (FTO).

A pixel defining layer 155, which divides a pixel area so as to correspond to each pixel PXL, is disposed on the substrate 100 on which the first electrode 160 and the like is disposed. The pixel defining layer 155 may be an organic insulating layer formed of an organic material. The organic material may include an organic insulating material, such as a polyacrylic compound, a polyimide compound, a fluorinate carbon compound, such as Teflon, and/or a benzocyclobutene compound. The pixel defining layer 155 exposes an upper surface of the first electrode 160, and protrudes from the substrate 100 along a circumference of the pixel PXL.

The light emitting layer 170 is disposed in the pixel area surrounded by the pixel defining layer 155. The light emitting layer 170 may include a low molecular or high molecular material. The low molecular material may include copper phthalocyanine (CuPc), N,N'-Di(naphthalene-1-yl)-N,N'-diphenyl-benzidine (NPB), tris-8-hydroxyquinoline aluminum ($Alq_3$), and the like. The materials may be formed by a vapor depositing method. The high molecular material may include EDOT, a poly-phenylenevinylene (PPV) based material, and/or a polyfluorene based material.

The light emitting layer 170 may include only a single layer, but may alternatively include multiple layers such as various functional layers. When the light emitting layer 170 includes multiple layers, the light emitting layer 170 may have a structure, in which a Hole Injection Layer (HIL), a Hole Transport Layer (HTL), an Emission Layer (EML), an Electron Transport Layer (ETL), and an Electron Injection Layer (EIL) are laminated in a single or complex structure. The light emitting layer 170 may be formed by a screen printing method, an inkjet printing method, a Laser Induced Thermal Imaging (LITI) method, or the like.

The light emitting layer 170 is not necessarily limited to the structure described herein, and may have various different structures.

The second electrode 180 is disposed on the light emitting layer 170. The second electrode 180 may also be connected to each pixel PXL, may cover most of the display area DA, and may be shared by the plurality of pixels PXL.

The second electrode 180 may be used as either an anode electrode or a cathode electrode according to an exemplary embodiment of the present invention, and when the first electrode 160 is an anode electrode, the second electrode 180 may be used as a cathode electrode. When the first electrode 160 is a cathode electrode, the second electrode 180 may be used as an anode electrode.

The second electrode 180 may be formed of a metal layer of gold (Au), silver (Ag), aluminum (Al), molybdenum (Mo), platinum (Pt), palladium (Pd), nickel (Ni), neodymium (Nd), and/or chromium (Cr). According to an exemplary embodiment of the present disclosure, the second electrode 180 may include multiple layers including two or more layers having a metal thin film.

When an image is desired to be displayed on the bottom of the substrate 100, the second electrode 180 may be formed of a metal reflective layer and/or a transparent conductive layer, and when an image is desired to be displayed on top of the substrate 100, the second electrode 180 may be formed of a transparent conductive layer.

The encapsulation layer 200 is disposed on the second electrode 180. The encapsulation layer 200 covers the organic light emitting diode OLED to prevent moisture or oxygen from infiltrating into the organic light emitting diode OLED. The encapsulation layer 200 may include only a single layer, but may alternatively include multiple layers.

According to an exemplary embodiment of the present disclosure, the encapsulation layer 200 may include first to third encapsulation layers which are sequentially laminated on the second electrode 180. The first to third encapsulation layers may be formed of an organic material and/or an inorganic material. The third encapsulation layer disposed at the outermost side may be formed of an inorganic material. According to an exemplary embodiment of the present disclosure, the first encapsulation may be formed of an inorganic material, the second encapsulation may be formed of an organic material or an inorganic material, and the third encapsulation may be formed of an inorganic material. Where the inorganic material is used, less moisture or oxygen permeates than when the organic material is used, but elasticity or flexibility is more limited, so that the inorganic material is vulnerable to cracking. A spreading of a crack may be prevented by forming the first encapsulation layer and the third encapsulation with an inorganic material and forming the second encapsulation layer with an organic material.

For convenience of the description, FIG. 2 illustrates that the encapsulation layer 200 completely covers the dam unit 300 in the non-display area NDA of the substrate 100. Here, the encapsulation layer including the organic material in the encapsulation layer 200 may be disposed at an inner side of the dam unit 300. The encapsulation layer including the inorganic material in the encapsulation layer 200 may be disposed at an external side of the dam unit 300 while completely covering the encapsulation layer including the organic material so as to prevent an end portion of the encapsulation layer including the organic material from being exposed.

According to an exemplary embodiment of the present disclosure, an organic insulating material, such as a polyacrylic compound, a polyimide compound, a fluorinate carbon compound, such as Teflon, and/or a benzocyclobutene compound may be used as the organic material. Polysiloxane, a silicon nitride, a silicon oxide, and/or a silicon oxynitride may be used as the inorganic material.

The encapsulation layer 200 may be formed as either a single layer or in multiple layers and a material of the encapsulation layer 200 need not be limited to the materials above. Various changes may be made to the structure and composition of the encapsulation layer 200. For example, the encapsulation layer 200 may include a plurality of organic material layers and a plurality of inorganic material layers which are alternately laminated.

Next, the non-display area NDA will be described. To the extent that some details are not described herein, it may be assumed that these missing details are similar to or identical to those corresponding details previously described.

According to an exemplary embodiment of the present disclosure, the non-display area NDA includes the driver 190 for driving the thin film transistor TFT and the organic light emitting diode OLED, the dam unit 300 surrounding the border of the display area DA, and the reinforcing member 400 surrounding the dam unit 300.

The buffer layer 110 and the reinforcing member 400 are disposed on the non-display area NDA of the substrate 100. The buffer layer 110 may have an opening OP in the non-display area. The buffer layer 110 may be spaced apart from the reinforcing member 400 with the opening OP interposed therebetween.

The reinforcing member 400 may be formed of an inorganic insulating material including an inorganic material. Herein, the reinforcing member 400 may be disposed on the same layer as that of the buffer layer 110 and may be formed of the same material in the same process step as those of the buffer layer 110. However, the invention is not limited to this. For example, the reinforcing member 400 may be disposed on the same layer as that of the gate insulating layer 125 of the display area DA, and the reinforcing member 400 may be formed of the same material in the same process step as those of the gate insulating layer 125. Further, the reinforcing member 400 may be disposed on the same layer as that of the interlayer insulating layer 135 of the display area DA, and may be formed of the same material in the same process step as those of the interlayer insulating layer 135.

As described above, the reinforcing member 400 may be formed in a single layer, but the present invention is not limited to this particular arrangement. For example, the reinforcing member 400 may be disposed in dual layers, in which a first inorganic insulating layer is disposed on the same layer as that of the buffer layer 110 and a second inorganic insulating layer is disposed on the same layer as that of the gate insulating layer 125. The first and second inorganic insulation layers are sequentially laminated. Further, the reinforcing member 400 may be disposed in multiple layers, in which the first inorganic insulating layer is disposed on the same layer as that of the buffer layer 110, the second inorganic insulating layer is disposed on the same layer as that of the gate insulating layer 125, and a third inorganic insulating layer is disposed on the same layer as that of the interlayer insulating layer 135. The first, second, and third inorganic insulating layers are sequentially laminated.

The reinforcing member 400 may be formed of a metal. The reinforcing member 400 may be formed of gold (Au), silver (Ag), aluminum (Al), molybdenum (Mo), chromium (Cr), nickel (Ni), neodymium (Nd), and/or copper (Cu), and/or an alloy of the metals. Further, the reinforcing member 400 may be formed as a single layer, but the present invention is not limited to this particular arrangement. For example, the reinforcing member 400 may be formed as multiple layers, in which two or more materials among the metals and the alloys listed above are laminated.

When an impact is applied to the substrate 100, the reinforcing member 400 prevents a crack that is formed by the impact from spreading to the display area DA of the substrate 100. For example, when the reinforcing member 400 is formed of a metal, power may be applied to the reinforcing member 400 to determine whether the reinforcing member 400 has been damaged by a crack.

A gate insulating layer 125 is disposed on the buffer layer 110. The gate insulating layer 125 may have an opening OP corresponding to the opening OP of the buffer layer 110 in the non-display area.

The driver 190 is disposed on the gate insulating layer 125. The driver 190 may include, for example, power supply lines and various circuit patterns, such as an anti-static pattern.

A conductive layer 195 is disposed on the driver 190. The conductive layer 195 may be electrically connected with the driver 190, and may be formed of the same material in the same process step as those of the first electrode 160 in the display area.

The dam unit 300 is disposed on the conductive layer 195. The dam unit 300 may be formed of an organic insulating material including an organic material. For example, the dam unit 300 may include only a single layer, which is disposed on the same layer as that of the pixel defining layer 155 of the display area DA and is formed of the same material in the same process step as those of the pixel defining layer 155. However, the particular arrangement of the dam unit 300 is not limited to the structure described herein. For example, the dam unit 300 may include only a single layer, which is disposed on the same layer as that of the passivation layer 145 of the display area DA, and may be formed of the same material in the same process step as those of the passivation layer 145. Further, the dam unit 300 may include dual layers, in which a first organic insulating layer is disposed on the same layer as that of the passivation layer 145 and a second organic insulating layer is disposed on the same layer as that of the pixel defining layer 155. The first and second organic insulating layers are sequentially laminated.

For the convenience of the description, FIG. 2 illustrates that the dam unit 300 is disposed on the same layer as that of the pixel defining layer 155.

The dam unit 300 prevents the organic material included in the encapsulation layer 200 from flowing past the non-display area during the manufacturing process. For example, the dam unit 300 may prevent the organic material from overflowing beyond the non-display area NDA by controlling a flow speed of the organic material included in the encapsulation layer 200.

Figure 3:
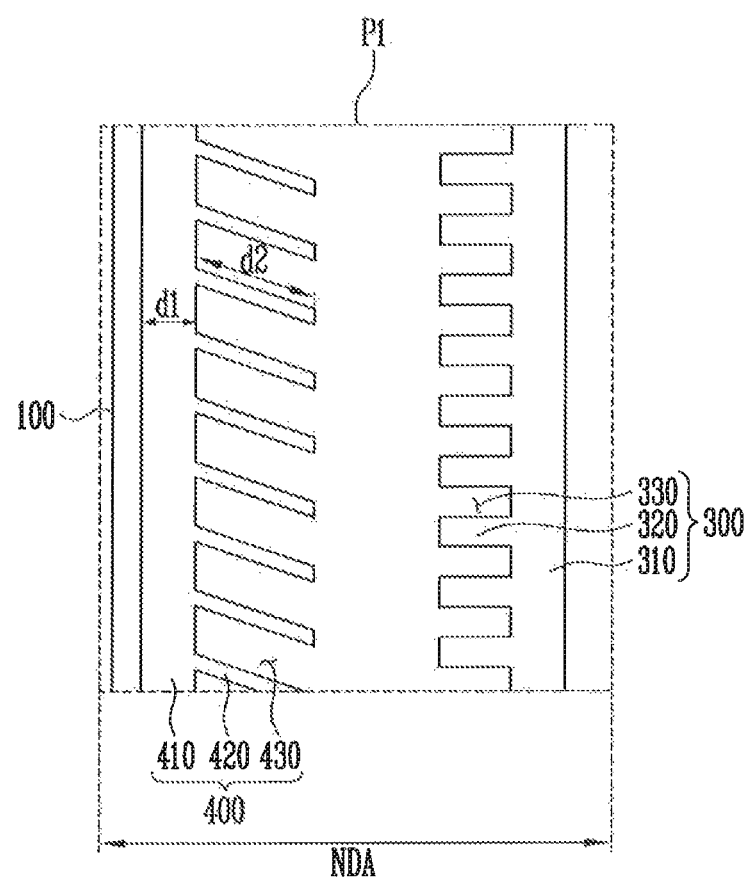
FIG. 3 is a top plan view conceptually illustrating a part corresponding to P1 of FIG. 1, and illustrates a disposition relation between a dam unit and a reinforcing member.

FIG. 3 is a top plan view conceptually illustrating a part corresponding to P1 of FIG. 1, and illustrates a disposition relation between the dam unit and the reinforcing member.

Referring to FIGS. 1 and 3, A dam unit 300 and A reinforcing member 400 are disposed in the non-display area NDA of the substrate 100.

The dam unit 300 is disposed in the non-display area NDA while surrounding the border of the display area DA of the substrate 100. The dam unit 300 includes a body part 310 extended in a predetermined direction (for example, a vertical direction) and a plurality of protrusions 320 protruding from the body part 310. The plurality of protrusions 320 may protrude in a different direction from the direction of extension of the body part 310. For example, when the body part 310 extends in the predetermined direction, the plurality of protrusions 320 may protrude in another direction (for example, a horizontal direction) crossing the predetermined direction.

The body part 310 of the dam unit 300 may be disposed between the display area DA (see FIG. 1) and the plurality of protrusions 320. Each of the plurality of protrusions 320 may protrude from one surface of the body part 310, may face the reinforcing member 400, and may have a rectangular shape when viewed on a plane. The body part 310 and the plurality of protrusions 320 may be integrally formed, and may be formed of an organic insulating material including an organic material. Each of the plurality of protrusions 320 is spaced apart from an adjacent protrusion by a predetermined interval, and cavities 330 may be disposed between the protrusions 320. The dam unit 300 may have a comb shape when viewed on a plane.

When an organic material included in the encapsulation layer 200 (see FIG. 2) moves to the non-display area NDA of the substrate 100 during a manufacturing process, the organic material may run up against the body part 310 of the dam unit 300, so that a flow speed of the organic material may be decreased. Further, when the organic material climbs over the body part 310 and continuously flows to the non-display area, the organic material may come to rest in the cavities 330 between the plurality of protrusions 320 and a flow speed of the organic material may be decreased. Accordingly, it is possible to prevent the organic material from completely overflowing past the non-display area NDA of the substrate 100. Here, the dam unit 300 may serve as an obstacle, such as a baffle, which decreases a flow speed of the organic material.

Further, when external light is incident to the display device, according to an exemplary embodiment of the present disclosure, light interference is generated in the plurality of protrusions 320 by the comb shape of the plurality of protrusions 320. Through the light interference, the organic material, which may overflow past the dam unit 300, is viewed, so that it is possible to confirm a boundary of the organic material, e.g. it is possible to see where the organic material came to rest. As a result, it is possible to prevent defects in display panels that may be caused by an overflow of the organic material by confirming the boundary of the organic material flowing to the non-display area NDA.

The reinforcing member 400 is disposed in the non-display area NDA so as to surround a border of the dam unit 300. The reinforcing member 400 includes a main body 410 extended in the predetermined direction and a plurality of branches 420 protruding from the main body 410. The plurality of branches 420 may protrude in a different direction from the direction of extension of the main body 410. For example, when the main body 410 extends in the predetermined direction, the plurality of branches 420 may extend in a diagonal direction inclined with respect to the predetermined direction. Here, when the main body 410 extends in the same direction as that of the body part 310 of the dam unit 300 when viewed on a plane.

The main body 410 of the reinforcing member 400 may be disposed at the outermost side within the non-display area NDA of the substrate 100. The plurality of branches 420 of the reinforcing member 400 may protrude from one surface of the main body 410 so as to face the dam unit 300.

The main body 410 and the plurality of branches 420 may be integrally formed, and may be an inorganic insulating material including an inorganic material. Each of the plurality of branches 420 is spaced apart from an adjacent branch by a predetermined interval Cavities 430 may be disposed between the branches 420. The plurality of branches 420 may have a comb shape when viewed on a plane.

The plurality of branches 420 of the reinforcing member 400 and the plurality of protrusions 320 of the dam unit 300 may be disposed so as to face one another in the non-display area NDA of the substrate 100, when viewed on a plane.

When viewed on a plane, a width d1 in a horizontal direction of the main body 410 within the non-display area NDA of the substrate 100 may be different from a width d2 in a horizontal direction of each of the plurality of branches 420. Hereinafter, for convenience of description, the width d1 in the horizontal direction of the main body 410 is referred to as a first width d1, and the width d2 in the horizontal direction of each of the plurality of branches 420 is referred to as a second width d2.

The second width d2 may be larger than the first width d1. For example, a ratio of the second width d2 and the first width d1 may be 3:1 to 2:1.

When an impact is applied to the substrate 100, a crack may be formed by the impact and the crack may progress in a direction of the display area DA of the substrate 100 via the reinforcing member 400.

When the second width d2 is equal to or smaller than the first width d1 and an impact is applied to the substrate 100, a progress path of a crack that is generated by the impact is shortened and the crack is transferred to the display area DA of the substrate 100, thereby causing a defect of the substrate 100.

Further, when an impact is applied to the substrate 100 and the reinforcing member 400 includes only the main body 410, a progress path of a crack caused by the impact is shortened and the crack is transferred to the display area DA of the substrate 100, thereby causing a defect of the substrate 100.

According to an exemplary embodiment of the present disclosure, the reinforcing member 400 is designed so that the width d2 in the horizontal direction of the plurality of branches 420 is larger than the width d1 in the horizontal direction of the main body 410. When an impact is applied to the substrate 100, a crack caused by the impact progresses to each of the plurality of branches 420 via the main body 410 of the reinforcing member 400, and the width d2 in the horizontal direction of the plurality of branches 420 is increased, so that the progress path of the crack is increased. When the progress path of the crack is increased, the progression of the crack may be dispersed and/or blocked when the crack progresses from the reinforcing member 400 to the display area DA. Accordingly, even when an impact is applied to the substrate 100, it is possible to keep the crack from progressing into the display area DA of the substrate 100. As a result, the reinforcing member 400 may block the crack from being transferred to the display area DA of the substrate 100, thereby increasing the mechanical strength of the display device.

Further, when an external light is directed to the display device, light interference may be generated in the plurality of branches 420 by the comb shape of the plurality of branches 420. Through the light interference, the organic material of the encapsulation layer 200 (see FIG. 2), which may climb over the dam unit 300 and overflow to the outside of the dam unit 300, may be observed/viewed and a boundary of the organic material may be identified.

It is to be noted that while the figures show a one-to-one correspondence between the dam units 300 and the reinforcing members 400 on each side of the substrate 100, the present invention is not limited to this arrangement and each side of the substrate 100 may have a different number of dam units 300 and/or reinforcing members 400.

There may be one or more dam units 300 surrounding the display area DA along the border of the display area DA of the substrate 100, and the number and configuration of these dam units 300 may be different by region. Further, there may be one or more reinforcing members 400 surrounding the dam unit 300 along the border of the dam unit 300 within the non-display area of the substrate 100, and the number and configuration of these reinforcing members 400 may also be different by region.

According to an exemplary embodiment of the present disclosure, the dam unit 300 may have various shapes, and FIGS. 4A to 4F are top plan views illustrating various shapes of the dam unit according to exemplary embodiments of the present disclosure.

FIGS. 4A to 4F are top plan views illustrating other forms of the dam unit of FIG. 3.

Figure 4A:
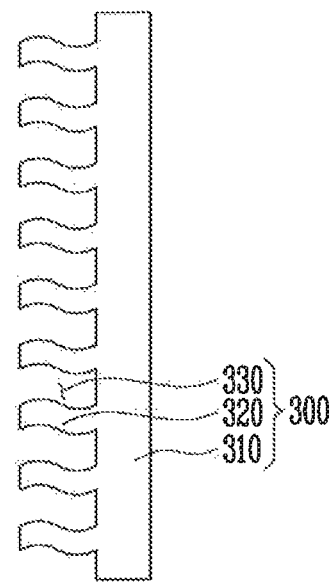
FIGS. 4A to 4F are top plan views illustrating other forms of the dam unit of FIG. 3.

First, referring to FIGS. 3 and 4A, the dam unit 300 includes a body part 310 and a plurality of protrusions 320 protruding from the body part 310.

The body part 310 may extend in a predetermined direction (for example, a vertical direction). The plurality of protrusions 320 may protrude in a different direction from the direction of extension of the body part 310. For example, when the body part 310 extends in the predetermined direction, the plurality of protrusions 320 may protrude in another direction (for example, a horizontal direction) crossing the predetermined direction.

The body part 310 and the plurality of protrusions 320 may be integrally formed, and the integral formation may be an organic insulating material including an organic material.

When viewed on a plane, each of the plurality of protrusions 320 may protrude from one surface of the body part 310 and may have a moiré pattern shape including a side formed of a straight line and a curve line. Each of the plurality of protrusions 320 is spaced apart from an adjacent protrusion by a predetermined interval, and cavities 330 may be disposed between the protrusions. The cavity 330 may have a moiré pattern shape corresponding to the shape of the plurality of protrusions 320.

When an organic material included in the encapsulation layer 200 (see FIG. 2) moves to the non-display area of the substrate 100 during a manufacturing process, the organic material may run up against the body part 310, so that a flow speed of the organic material may be decreased. When the organic material climbs over the body part 310, the organic material may come to rest in the cavities 330 and a flow speed of the organic material may be decreased. For example, in FIG. 4A, the plurality of protrusions 320 and the cavities 330 have the moiré pattern shapes, so that contact areas between the organic material and the plurality of protrusions 320 may be increased and a flow speed of the organic material may be decreased.

Figure 4B:
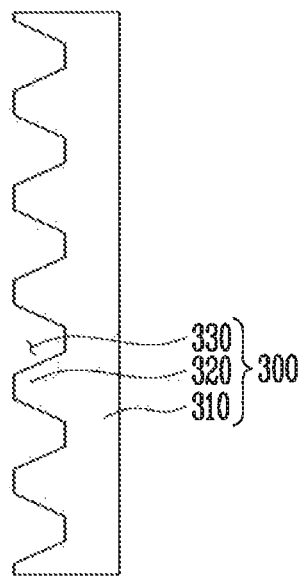

Referring to FIGS. 3 and 4B, the dam unit 300 includes a body part 310 extended in a predetermined direction (for example, a vertical direction) and a plurality of protrusions 320 protruding from the body part 310. The plurality of protrusions 320 may protrude in a different direction from the direction of extension of the body part 310.

When viewed on a plane, each of the plurality of protrusions 320 may protrude from one surface of the body part 310 and may have a polygonal shape including a side formed of a straight line. For example, each of the plurality of protrusions 320 may have a polygonal shape, of which a width decreases farther from the body part 310. Each of the plurality of protrusions 320 is spaced apart from an adjacent protrusion by a predetermined interval, and cavities 330 may be disposed between the protrusions. The cavity 330 may have a polygonal shape corresponding to the shape of the plurality of protrusions 320. For example, a width of the cavity 330 may increase farther from the body part 310.

When an organic material included in the encapsulation layer 200 (see FIG. 2) moves to the non-display area of the substrate 100 during a manufacturing process, the organic material may run up against the body part 310, so that a flow speed of the organic material may be decreased. When the organic material climbs over the body part 310, the organic material may come to rest in the cavities 330 and a flow speed of the organic material may be decreased. For example, in FIG. 4B, the cavity 330 has the polygonal shape, of which the width increases farther from the body part 310, so that a flow speed of the organic material may be decreased.

Figure 4C:
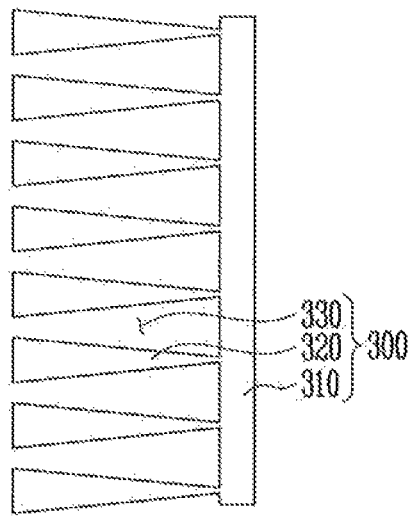

Referring to FIGS. 3 and 4C, the dam unit 300 includes a body part 310 extended in a predetermined direction (for example, a vertical direction) and a plurality of protrusions 320 protruding from the body part 310.

When viewed on a plane, each of the plurality of protrusions 320 may have a triangular shape, of which the width is increased as being far from the body part 310. Each of the plurality of protrusions 320 is spaced apart from an adjacent protrusion by a predetermined interval, and cavities 330 may be disposed between the protrusions. The cavity 330 may have a triangular shape corresponding to the shape of the plurality of protrusions 320. For example, a width of the cavity 330 may decrease farther from the body part 310.

Figure 4D:
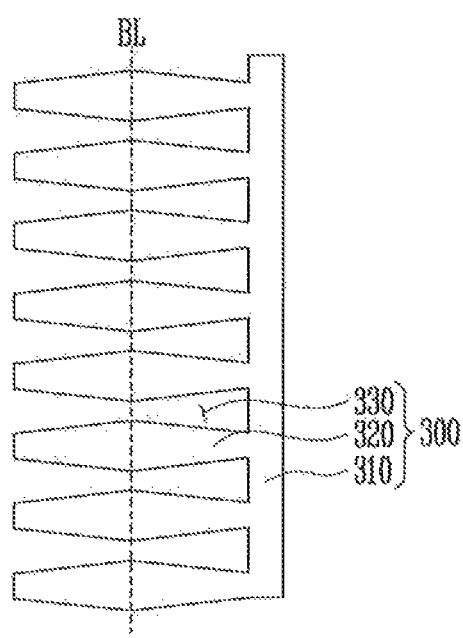

Referring to FIGS. 3 and 4D, the dam unit 300 includes a body part 310 extended in a predetermined direction (for example, a vertical direction) and a plurality of protrusions 320 protruding from the body part 310.

When viewed on a plane, each of the plurality of protrusions 320 may have a polygonal shape, which includes a straight side, and of which a width increases and then decreases farther from the body part 310, however, the shape of each of the plurality of protrusions 320 is not limited to any of the particular shapes described herein. For example, each of the plurality of protrusions 320 may have an elliptical shape, which includes a side formed of a curved line, and of which a width increases and then decreases farther from the body part 310.

For example, the plurality of protrusions 320 may have a shape which is bilaterally symmetric based on a virtual line BL disposed at a center of the plurality of protrusions 320. Here, a width of each of the plurality of protrusions 320 may be approximately 10 μm to 65 μm.

The cavity 330 disposed between the plurality of protrusions 320 may have a polygonal shape, of which a width decreases farther from the body part 310 and increases when passing through the virtual line BL.

In a case where the cavity 330 has the same width and a rectangular shape when viewed on a plane, when the organic material of the encapsulation layer 200 (see FIG. 2) flows to the non-display area, a flow speed of the organic material may be increased by capillary force in the cavity 330. Accordingly, the organic material may overflow the dam unit 300.

Accordingly, the dam unit 300, according to an exemplary embodiment of the present disclosure, may be designed so that each of the plurality of protrusions 320 has a polygonal shape that increases the contact areas between the organic material and the plurality of protrusions 320, thereby reducing capillary force and decreasing a flow speed of the organic material. Further, in the dam unit 300, the cavity 330, in which the organic material comes to rest, has a different width, thereby decreasing a flow speed of the organic material. Accordingly, it is possible to prevent the organic material of the encapsulation layer 200 from overflowing the dam unit 300.

Figure 4E:
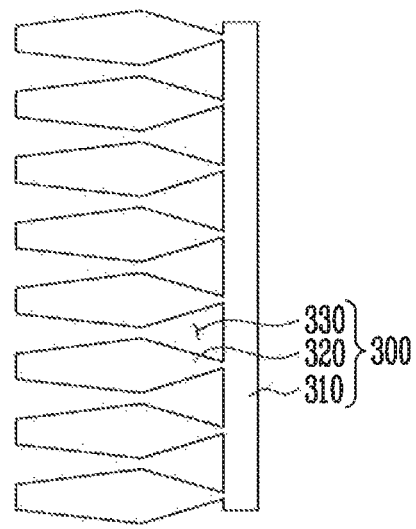

Referring to FIGS. 3 and 4E, the dam unit 300 includes a body part 310 extended in a predetermined direction (for example, a vertical direction) and a plurality of protrusions 320 protruding from the body part 310.

When viewed on a plane, each of the plurality of protrusions 320 may have a polygonal shape, of which a width increases farther from the body part 310 and then decreases again. Further, the cavity 330 disposed between the plurality of protrusions 320 may have a polygonal shape, of which a width decreases farther from the body part 310 and then increases again.

Figure 4F:
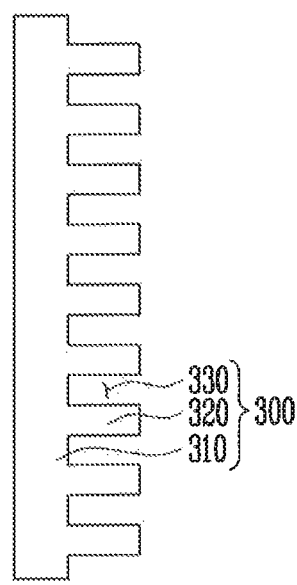

Referring to FIGS. 3 and 4F, the dam unit 300 includes a body part 310 extended in a predetermined direction (for example, a vertical direction) and a plurality of protrusions 320 protruding from the body part 310.

The plurality of protrusions 320 may protrude in a different direction from the direction of extension of the body part 310. For example, when the body part 310 extends in the predetermined direction, each of the plurality of protrusions 320 may protrude in another direction (for example, a horizontal direction) crossing the predetermined direction. Here, the plurality of protrusions 320 protrude from the other surface of the body part 310 so as to face the display area DA (see FIG. 2) of the substrate 100, and each of the plurality of protrusions 320 may have a rectangular shape including straight sides, when viewed on a plane.

Each of the plurality of protrusions 320 is spaced apart from an adjacent protrusion by a predetermined interval, and cavities 330 may be disposed between the protrusions.

Figure 5A:
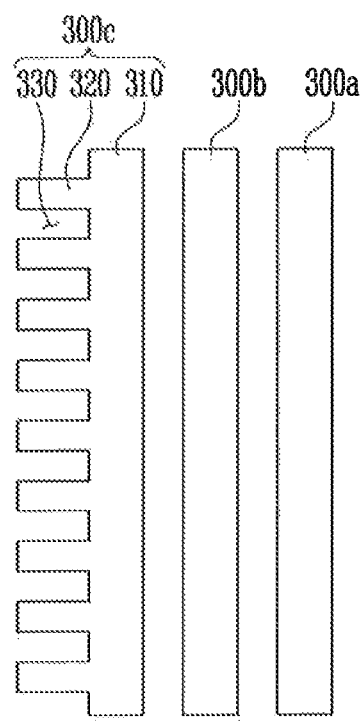
FIGS. 5A and 5B are top plan views illustrating a disposition of the plurality of dam units of FIG. 3.
Figure 5B:
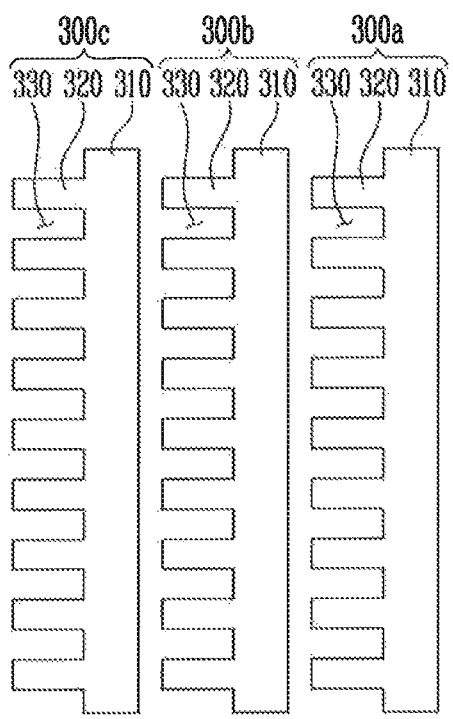

FIGS. 5A and 5B are top plan views illustrating a disposition of the plurality of dam units of FIG. 3.

First, referring to FIGS. 3 and 5A, first to third dam units 300a, 300b, and 300c may be disposed in the non-display area of the substrate 100.

The first dam unit 300a is disposed between the border of the display area DA (see FIG. 2) and the second dam unit 300b, the second dam unit 300b is disposed between the first dam unit 300a and the third dam unit 300c, and the third dam unit 300c is disposed between the reinforcing member 400 and the second dam unit 300b. The first to third dam units 300a, 300b, and 300c may be formed of an organic insulating material including an organic material.

The first dam unit 300a and the second dam unit 300b may extend in a predetermined direction (for example, a vertical direction), and may have a rectangular shape including straight sides.

The third dam unit 300c includes a body part 310 and a plurality of protrusions 320 protruding from the body part 310. The body part 310 may extend in the predetermined direction. The plurality of protrusions 320 may protrude in a different direction from the direction of extension of the body part 310. For example, when the body part 310 extends in the predetermined direction, the plurality of protrusions 320 may protrude in another direction (for example, a horizontal direction) crossing the predetermined direction.

When viewed on a plane, each of the plurality of protrusions 320 may protrude from one surface of the body part 310 and may have a rectangular shape including a side formed of a straight line. Each of the plurality of protrusions 320 is spaced apart from an adjacent protrusion by a predetermined interval, and cavities 330 may be disposed between the protrusions.

The third dam unit 300c, which is disposed at the outermost side among the first to third dam units 300a, 300b, and 300c, may have a comb shape when viewed on a plane. The third dam unit 300c may serve as an obstacle/baffle decreasing a flow speed of the organic material when the organic material included in the encapsulation layer 200 (see FIG. 2) moves to the non-display area of the substrate 100.

FIG. 3 illustrates that the third dam unit 300c, which is disposed at the outermost side among the first to third dam units 300a, 300b, and 300c, includes the body part 310 and the plurality of protrusions 320, however, the present invention is not limited to this particular arrangement of the dam units. For example, as illustrated in FIG. 5B, each of the first to third dam units 300a, 300b, and 300c may include the body part 310 and the plurality of protrusions 320 protruding from the body part 310.

Figure 6:
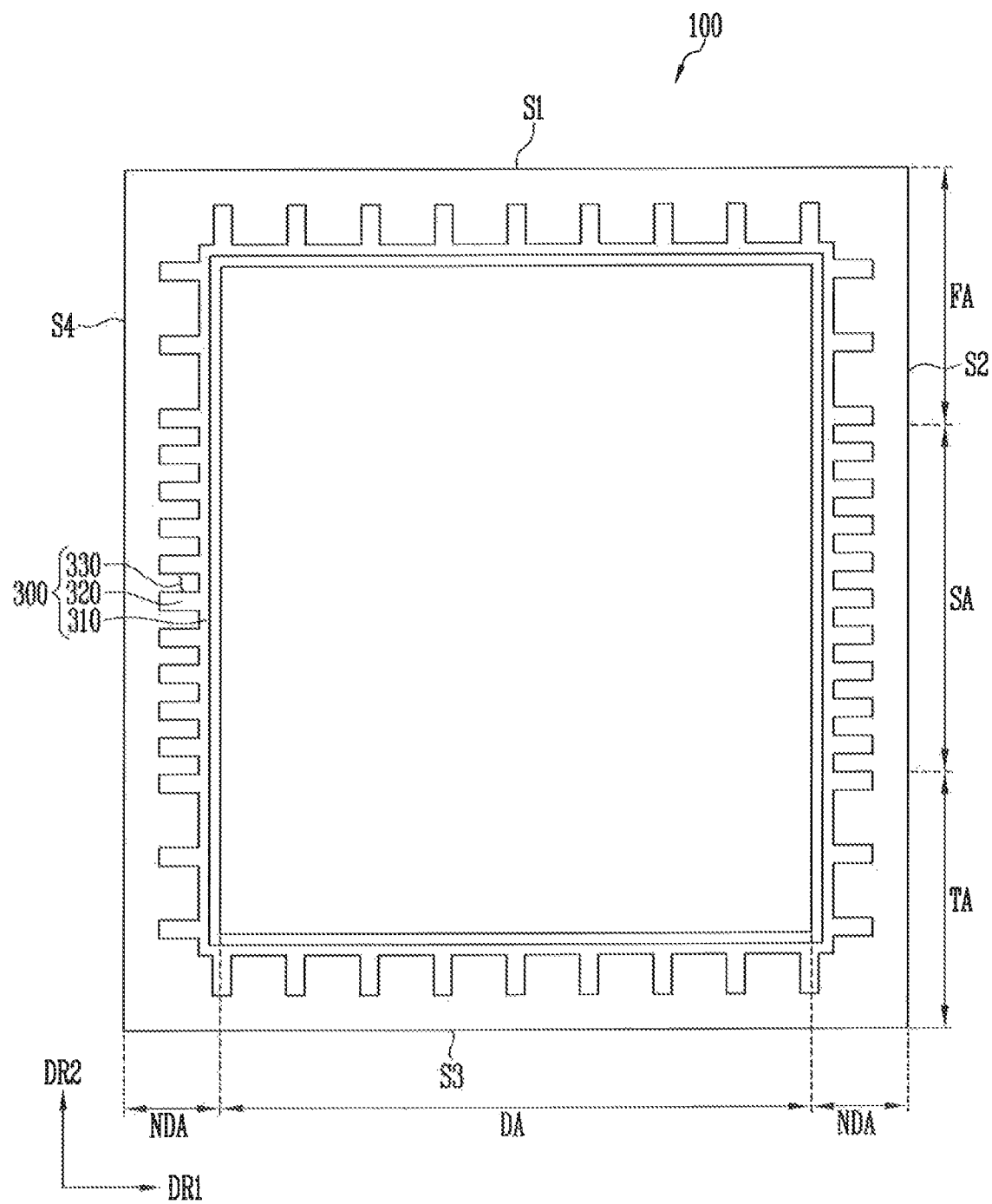
FIG. 6 is a top plan view illustrating a disposition structure of the dam unit in the display device according to an exemplary embodiment of the present disclosure.

FIG. 6 is a top plan view illustrating a disposition structure of a dam unit in a display device according to an exemplary embodiment of the present disclosure. In FIG. 6, a reinforcing member is disposed on a substrate, but for convenience of the description, the illustration of the reinforcing member is omitted.

Referring to FIG. 6, a display device according to an exemplary embodiment of the present disclosure includes a substrate 100 and a dam unit 300 disposed on the substrate 100.

The substrate 100 includes a display area DA and a non-display area NDA disposed at least one side of the display area DA.

The substrate 100 may have an approximately square shape, for example, a rectangular shape. According to an exemplary embodiment of the present disclosure, the substrate 100 may include a pair of short sides S1 and S3 that are parallel to each other in a first direction DR1, and a pair of long sides S2 and S4 that are parallel to each other in a second direction DR1.

The non-display area NDA may be divided into first to third areas FA, SA, and TA along the pair of long sides S2 and S4.

The dam unit 300 includes a body part 310 surrounding a border of the display area DA within the non-display area NDA, and extended in the first direction DR1, and a plurality of protrusions 320 protruding from the body part 310.

The plurality of protrusions 320 may be disposed at various positions and/or various densities per unit area according to the degree of overflow of the organic material included in the encapsulation layer 200 (see FIG. 2). For example, in the second area SA of the non-display area NDA, in which the large amount of organic material tends to overflow, and in the first and second areas FA and TA of the non-display area NDA, in which the organic material tends to overflows less, a relatively large number of protrusions 320 may be disposed in the second area SA, and a smaller number of protrusions 320, than that of the protrusions 320 in the second area SA, may be disposed in the first and third areas FA and TA.

However, the present disclosure is not limited to this particular arrangement of protrusions 320.

As described above, the number of protrusions 320 to be disposed may be different for each area.

Figure 7A:
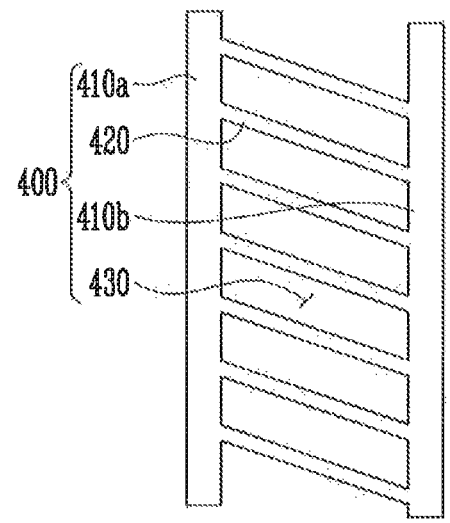
FIGS. 7A and 7B are top plan views illustrating other forms of the reinforcing member of FIG. 3.
Figure 7B:
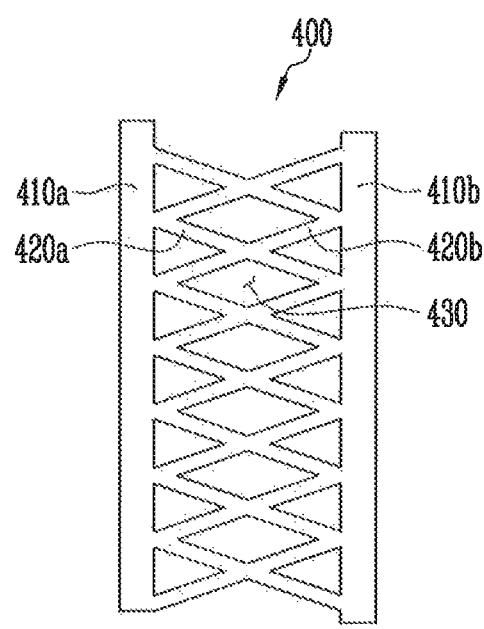

FIGS. 7A and 7B are top plan views illustrating other forms of the reinforcing member of FIG. 3.

Referring to FIGS. 3 and 7A, the reinforcing member 400 includes a first main body 410a and a second main body 410b, which are each extended in a predetermined direction (for example, a vertical direction) and are arranged to face each other. Further, the reinforcing member 400 includes a plurality of branches 420 disposed between the first main body 410a and the second main body 410b. The first main body 410a, the second main body 410b, and the plurality of branches 420 may be integrally formed, and the integral formation may be an inorganic insulating material including an inorganic material. The inorganic material may include a silicon nitride, a silicon oxide, and/or a silicon oxynitride.

One side of each of the plurality of branches 420 may be in contact with the first main body 410a, and the opposite side thereof may be in contact with the second main body 410b. Accordingly, when viewed on a plane, the plurality of branches 420 may be disposed between the first and second main bodies 410a and 410b and may be surrounded by the first and second main bodies 410a and 410b. Each of the plurality of branches 420 is spaced apart from an adjacent branch by a predetermined interval, and cavities 430 may be disposed between the plurality of branches 420.

The reinforcing member 400 may have a ladder shape when viewed on a plane.

When an impact is applied to the substrate 100, a crack caused by the impact progresses along the first main body 410a, the plurality of branches 420, and the second main body 410b, so that a progress path of the crack may be increased. When the progress path of the crack is increased, a part of the crack may be dispersed and blocked when the crack progresses from the reinforcing member 400 to the display area DA (see FIG. 2). Accordingly, even when an impact is applied to the substrate 100, it is possible to minimize the progress of a crack caused by the impact from extending to the display area DA.

Next, referring to FIGS. 3 and 7B, the reinforcing member 400 includes a first main body 410a and a second main body 410b, which are extended in a predetermined direction (for example, a vertical direction) and face each other. Further, the reinforcing member 400 includes a plurality of first branches 420a and a plurality of second branches 420b disposed between the first main body 410a and the second main body 410b.

One side of each of the plurality of first branches 420a may be in contact with the first main body 410a, and the other side thereof facing the one side may be in contact with the second main body 410b. One side of each of the plurality of second branches 420b may be in contact with the second main body 410b, and the other side thereof facing the one side may be in contact with the first main body 410a. Here, the one side of each of the plurality of first branches 420a may be in contact with the other side of each of the plurality of second branches 420b, and the other side of each of the plurality of first branches 420a may be in contact with the one side of each of the plurality of second branches 420b.

The plurality of first branches 420a and the plurality of second branches 420b may be disposed between the first and second main bodies 410a and 410b while crossing one another. Cavities 430 may be disposed between the plurality of first branches 420a and the plurality of second branches 420b.

When viewed on a plane, the plurality of first branches 420a and the plurality of second branches 420b may be surrounded by the first and second main bodies 410a and 410b, and may be disposed between the first and second main bodies 410a and 410b and may cross the areas between the first and second main bodies 410a and 410b from side to side.

Figure 8A:
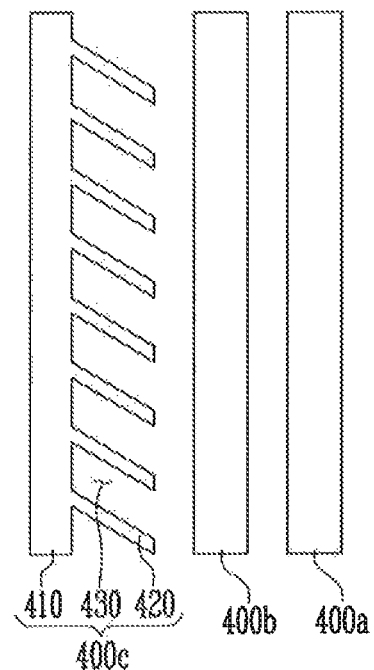
FIGS. 8A to 8C are top plan views illustrating a disposition of the plurality of reinforcing members of FIG. 3.
Figure 8B:
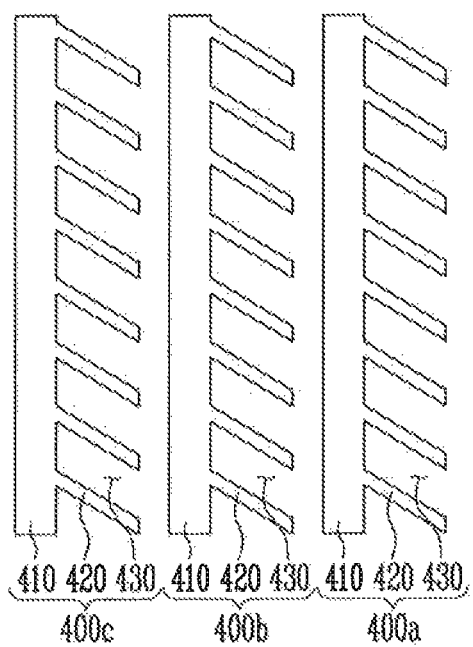
Figure 8C:
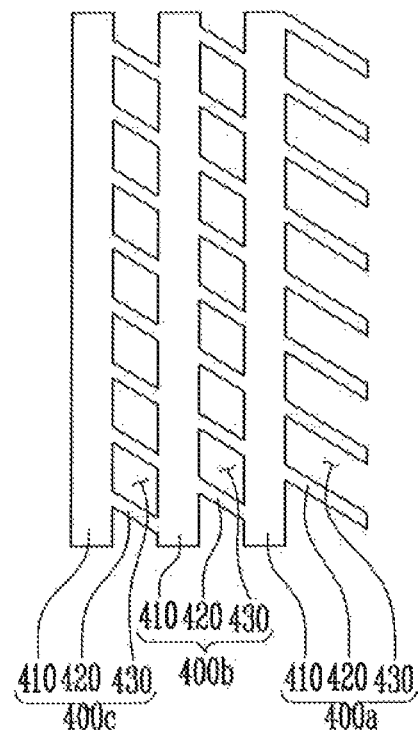

FIGS. 8A to 8C are top plan views illustrating a disposition of the plurality of reinforcing members of FIG. 3.

First, referring to FIGS. 3 and 8A, first to third reinforcing member units 400a, 400b, and 400c may be disposed in the non-display area NDA of the substrate 100.

The first reinforcing member 400a is disposed between the dam unit 300 of the substrate 100 and the second reinforcing member 400b, the second reinforcing member 400b is disposed between the first reinforcing member 400a and the third reinforcing member 400c, and the third reinforcing member 400c is disposed between the border of the substrate 100 and the second reinforcing member 400b. Herein, first to third reinforcing members 400a, 400b, and 400c may each be an inorganic insulating material including an inorganic material.

The first reinforcing member 400a and the second reinforcing member 400b may each extend in a predetermined direction (for example, a vertical direction), and may each have a rectangular shape including straight sides.

The third reinforcing member 400c includes a main body 410 and a plurality of branches 420 protruding from the main body 410. The main body 410 may extend in the predetermined direction. The plurality of branches 420 may protrude in a different direction from the direction of extension of the main body 410. For example, when the main body 410 extends in the predetermined direction, the plurality of branches 420 may extend in a diagonal direction inclined with respect to the predetermined direction.

When viewed on a plane, each of the plurality of branches 420 may protrude from one surface of the main body 410 and may have a rectangular shape including a side formed of a straight line. Each of the plurality of branches 420 is spaced apart from an adjacent branch by a predetermined interval, and cavities 430 may be disposed between the branches.

The third reinforcing member 400c, which is disposed at the outermost side among the first to third reinforcing members 400a, 400b, and 400c, may have a comb shape when viewed on a plane. The third reinforcing member 400c may disperse and block a crack caused by an impact when the impact is applied to the substrate 100.

It is illustrated that the third reinforcing member 400c disposed at the outermost side among the first to third reinforcing members 400a, 400b, and 400c includes the main body 410 and the plurality of branches 420, but the present disclosure is not limited thereto. For example, as illustrated in FIG. 8B, each of the first to third reinforcing members 400a, 400b, and 400c may include the main body 410 and the plurality of branches 420 protruding from the main body 410.

Further, the first to third reinforcing members 400a, 400b, and 400c may be disposed within the non-display area while being spaced apart from one another by a predetermined interval, but the present invention is not limited to that particular arrangement of the reinforcing members 400a, 400b, and 400c. For example, as illustrated in FIG. 8C, the plurality of branches 420 of each of the first to third reinforcing members 400a, 400b, and 400c may be in contact with the main body of the adjacent reinforcing member. For example, one surface (for example, the surface from which the plurality of branches 420 does not protrude) of the main body 410 of the first reinforcing member 400a may be in contact with the plurality of branches 420 of the second reinforcing member 400b, and one surface (for example, the surface from which the plurality of branches 420 does not protrude) of the main body 410 of the second reinforcing member 400b may be in contact with the plurality of branches 420 of the third reinforcing member 400c.

Figure 9:
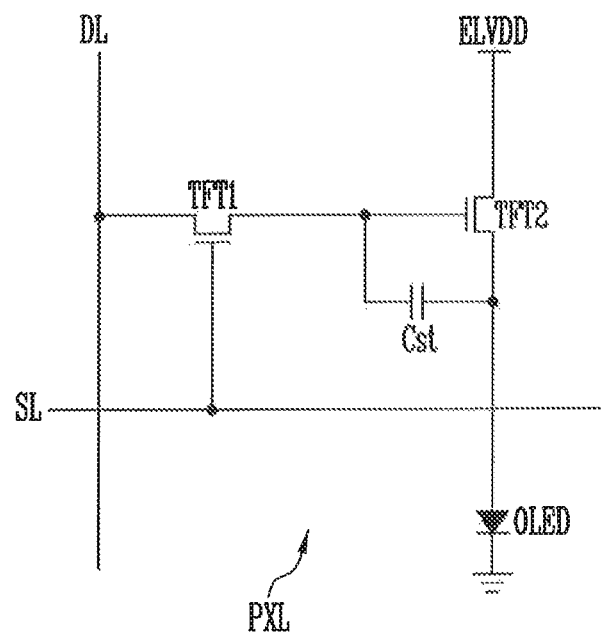
FIG. 9 is a circuit diagram corresponding to one pixel in the display device illustrated in FIG. 1.
Figure 10:
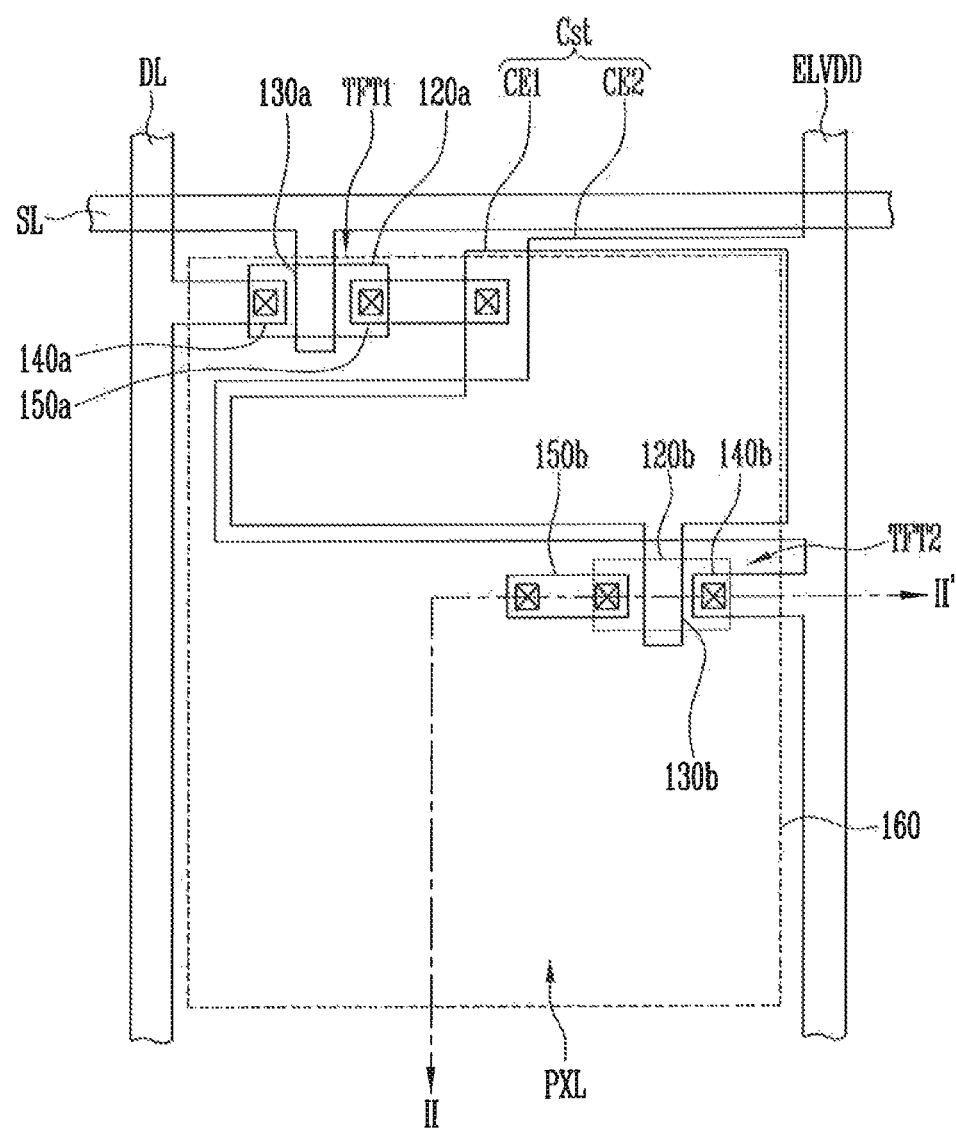
FIG. 10 is a top plan view corresponding to one pixel of FIG. 9.
Figure 11:
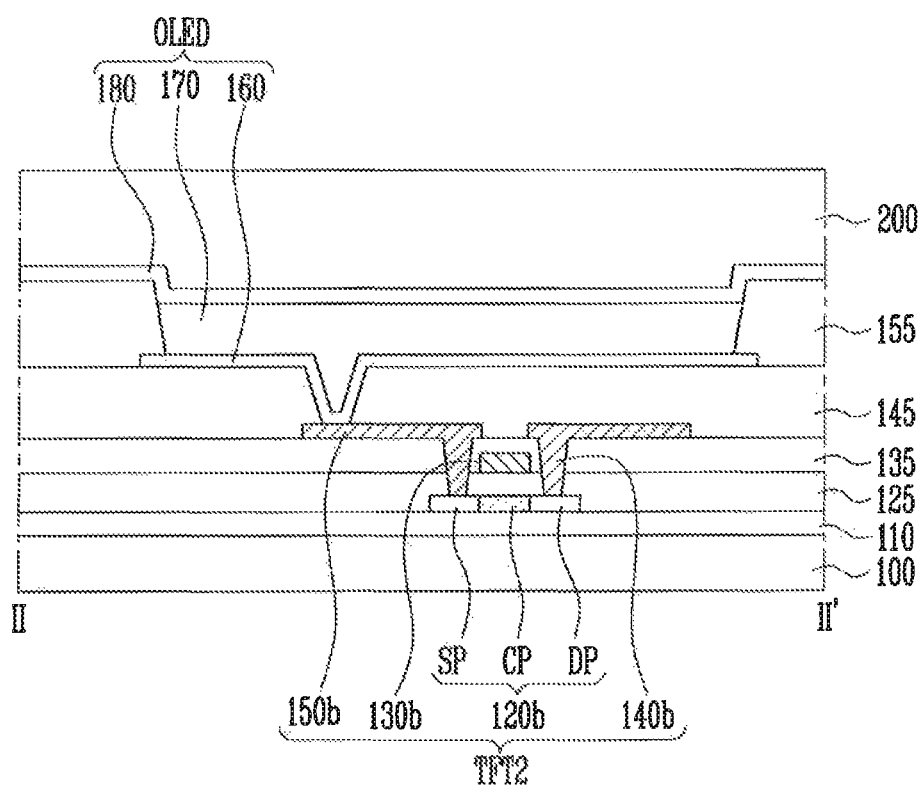
FIG. 11 is a cross-sectional view taken along line II-II' of FIG. 10.

FIG. 9 is a circuit diagram corresponding to one pixel in the display device illustrated in FIG. 1, FIG. 10 is a top plan view corresponding to one pixel of FIG. 9, and FIG. 11 is a cross-sectional view taken along line II-II' of FIG. 10. In FIG. 9, thin film transistors included in a pixel are set with an NMOS, however, other forms of thin film transistors may be used, for example, the thin film transistors may be set with a PMOS.

Referring to FIGS. 1, and 9 to 11, the display device includes a substrate 100, a wiring unit, and pixels PXL. Each pixel PXL displays an image, and the plurality of pixels PXL may be disposed and arranged in a matrix form, but FIGS. 9 and 10 illustrate only one pixel PXL for convenience of the description. Herein, each pixel is illustrated in a rectangular shape, but the shape of the pixel is not limited thereto, and the pixel PXL may be modified in various shapes.

The pixels PXL are disposed on the substrate 100.

The wiring unit provides a signal to the pixel PXL, and includes a scan line SL, a data line DL, and a driving voltage line ELVDD.

The scan line SL extends in a predetermined direction (for example, a horizontal direction). The data line DL extends in another direction crossing the scan line SL. The driving voltage line ELVDD may extend in the substantially same direction as either the scan line SL or the data line DL, for example, the driving voltage line ELVDD may extend in the direction of extension of the data line DL. The scan line SL transmits a scan signal to a thin film transistor, the data line DL transmits a data signal to the thin film transistor, and the driving voltage line ELVDD provides a driving voltage to the thin film transistor.

The pixel PXL includes a thin film transistor connected to the wiring unit, an organic light emitting diode OLED connected to the thin film transistor, and a capacitor Cst.

The thin film transistor may include a driving thin film transistor TFT2 for controlling the organic light emitting diode OLED and a switching thin film transistor TFT1 for switching the driving thin film transistor TFT2. According to an exemplary embodiment of the present disclosure, one pixel PXL may include the two thin film transistors TFT1 and TFT2 and one capacitor Cst, but the pixel PLX may be alternatively arranged.

The switching thin film transistor TFT1 includes a first gate electrode 130a, a first drain electrode 140a, and a first source electrode 150a. The first gate electrode 130a is connected to the scan line SL, and the first drain electrode 140a is connected to the data line DL. The first source electrode 150a is connected to a terminal of one side of the capacitor Cst. The switching thin film transistor TFT1 transmits a data signal applied to the data line DL to the capacitor Cst according to a scan signal applied to the scan line SL.

The capacitor Cst charges a voltage corresponding to the data signal.

The driving thin film transistor TFT2 includes a second gate electrode 130b, a second drain electrode 140b, and a second source electrode 150b. The second gate electrode 130b is connected to a terminal of one side of the capacitor Cst, the second drain electrode 140b is connected to the driving voltage line ELVDD, and the second source electrode 150b is connected to the organic light emitting diode OLED.

The switching thin film transistor TFT1 and the driving thin film transistor TFT2 may each include a first active pattern 120a and a second active pattern 120b, each of which is formed of a semiconductor material. Each of the first active pattern 120a and the second active pattern 120b includes a source region SP, a drain region DP, and a channel region CP. The first active pattern 120a and the second active pattern 120b may each be a semiconductor pattern formed of polysilicon, amorphous silicon, an oxide semiconductor, and/or an organic semiconductor material. Here, when the first active pattern 120a and the second active pattern 120b are formed of the oxide semiconductor, the oxide semiconductor may include an amorphous oxide semiconductor or a crystalline oxide semiconductor.

A passivation layer 145 is formed on the switching thin film transistor TFT1 and the driving thin film transistor TFT2. The passivation layer 145 may cover the switching thin film transistor TFT1 and the driving thin film transistor TFT2 and may include one or more layers. The passivation layer 145 includes a contact hole exposing a part of the second source electrode 150bb.

The organic light emitting diode OLED includes a light emitting layer 170, a first electrode 160, and a second electrode 180. The light emitting layer 170 is interposed between the first electrode 160 and the second electrode 180.

The first electrode 160 is connected to the second source electrode 150b of the driving thin film transistor TFT2. The first electrode 160 serves as an anode electrode and is an electrode for injecting holes, and may include a material having a high work function.

A pixel defining layer 155, which divides a pixel area so as to correspond to each pixel PXL, is disposed on the substrate 100 on which the first electrode 160 and the like is disposed. The pixel defining layer 155 may be an organic insulating layer formed of an organic material. The pixel defining layer 155 may include an organic insulating material, such as a polyacrylic compound, a polyimide compound, a fluorinate carbon compound, such as Teflon, and/or a benzocyclobutene compound.

The light emitting layer 170 emits light according to an output signal of the driving thin film transistor TFT2 and displays an image by selectively emitting light. Herein, light emitted from the light emitting layer 170 may be changed according to a material of the light emitting layer 170, and may be a single-color light or white light.

The second electrode 180 may include a material having a lower work function than that of the first electrode 160. For example, the second electrode 180 may include molybdenum (Mo), tungsten (W), silver (Ag), magnesium (Ag), aluminum (Al), platinum (Pt), palladium (Pd), gold (Au), nickel (Ni), neodymium (Nd), iridium (Ir), chromium (Cr), lithium (Li), calcium (Ca), and/or an alloy thereof.

An encapsulation layer 200 protecting the organic light emitting diode OLED from moisture or oxygen of the outside is disposed on the organic light emitting diode OLED.

The capacitor Cst is connected between the second gate electrode 130b of the driving thin film transistor TFT2 and the organic light emitting diode OLED. The capacitor Cst includes a first capacitor electrode CE1 connected to the first source electrode 150a of the switching thin film transistor TFT1, and a second capacitor electrode CE2 disposed on the first capacitor electrode CE1. The capacitor Cst charges and maintains a data signal input into the second gate electrode 130b of the driving thin film transistor TFT2.

The display device according to an exemplary embodiment of the present invention may include a touch screen.

Figure 12:
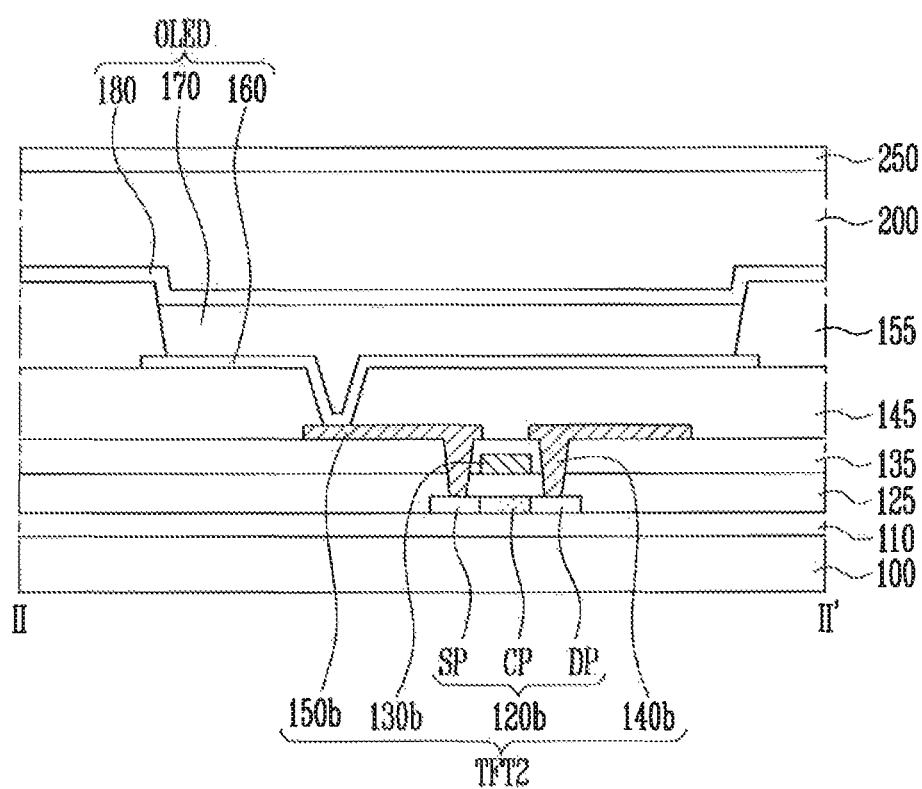
FIG. 12 is a cross-sectional view schematically illustrating a form, in which the display device of FIG. 11 adopts a touch screen.

FIG. 12 is a cross-sectional view schematically illustrating an arrangement in which the display device of FIG. 11 includes a touch screen.

Referring to FIGS. 11 and 12, a touch screen 250 may be disposed on the encapsulation layer 200.

The touch screen 250 may recognize a touch event to the display device. The touch event may be a hand of a user or a separate input means, such as a stylus, making contact with, and/or held in close proximity to the surface of the touch screen 250. The touch screen 250 includes sensing electrodes to detect a touch and/or a degree of pressure applied by the touch event. For example, the touch screen 250 may be implemented by a capacitance type or a piezo-resistive type touch screen. The capacitance type touch screen includes a mutual capacitance type which senses a change in capacitance by a mutual operation between two sensing electrodes, and a self-capacitance type touch screen which senses a change in capacitance of the sensing electrode itself.

The touch screen 250 may be formed by a method of directly forming the sensing electrodes on the encapsulation layer 200, a method of laminating a thin film having a film form including the sensing electrode on the encapsulation layer 200, or the like.

The touch screen 250 may include the sensing electrodes, and an insulating layer disposed between the sensing electrodes.

The sensing electrodes may be directly formed on a flexible film. The insulating layer may include an inorganic insulating material and/or an organic insulating material. When the insulating layer is an organic insulating material, flexibility of the touch screen 250 may be increased.

The display device, according to the exemplary embodiment of the present disclosure, may lack a polarizing layer for the sake of compactness. In the display device, in which the polarizing layer is omitted, a color filter and a black matrix may substitute for the function of the polarizing layer. In this case, the color filter and the black matrix may be disposed on the encapsulation layer 200. For example, the color filter and the black matrix may be directly disposed on the encapsulation layer 200 through a mask process using a mask.

The black matrix may be substituted with the pixel defining layer 155 disposed under the encapsulation layer 200. In this case, the pixel defining layer 155 may be a black pixel defining layer formed of a thermosetting resin including black pigment. The pixel defining layer 155 includes the black pigment, so that the dam unit 300 (see FIG. 3), which is formed of the same material in the same process step as those of the pixel defining layer 155, may include the black pigment.

At least a part of the display device, according to an exemplary embodiment of the present disclosure, may be flexible, and the display device may be arranged into various forms, such that at least a part of the display device is bent, folded, or rolled.

The display device, according to an exemplary embodiment of the present disclosure, may be applied to various electronic devices. For example, the display device may be applied to a television, a personal computer such as a notebook computer, a mobile phone, a smart phone, a tablet computer, a Portable Multimedia Player (PDP), a Personal Digital Assistant (PDA), a navigation guidance device, various wearable devices, such as a smart watch, and the like.

Although the present disclosure has been described with reference to the exemplary embodiments, those skilled in the art may understand that the present disclosure may be variously modified and changed without departing from the spirit and the scope of the present disclosure.

What is claimed is:

1. A display device, comprising:
a substrate including a display area, in which an image is displayed, and a non-display area, the non-display area being disposed on at least one side of the display area;
a plurality of pixels disposed in the display area;
a passivation layer disposed on the substrate;
a pixel defining layer disposed on the passivation layer;
an encapsulation layer disposed on the plurality of pixels; and
a dam unit disposed in the non-display area,
wherein the dam unit includes a body part and at least one protrusion which protrudes from the body part in a direction away from the display area,
wherein the passivation layer and the pixel defining layer each include an organic material, and
wherein the dam unit includes an organic material.

2. The display device of claim 1, wherein:
the body part extends in a first direction,
the at least one protrusion comprises a plurality of protrusions, and
each of the plurality of protrusions protrudes in a second direction that crosses the first direction.

3. The display device of claim 2, wherein the body part and the plurality of protrusions are integrally formed.

4. The display device of claim 2, wherein each of the plurality of protrusions is spaced apart from an adjacent protrusion of the plurality of protrusions by a predetermined interval.

5. The display device of claim 4, wherein cavities are disposed between each pair of proximate protrusions of the plurality of protrusions.

6. The display device of claim 5, wherein a width of each of the plurality of protrusions decreases farther away from the body part.

7. The display device of claim 6, wherein a width of each of the cavities increases farther away from the body part.

8. The display device of claim 2, wherein the plurality of protrusions is irregularly disposed along a region of the substrate.

9. The display device of claim 1, wherein the dam unit is disposed in plural within an area that surrounds the border between the non-display area and the display area.

10. The display device of claim 1, further comprising a reinforcing member disposed in the non-display area and including a main body and at least one branch which extends in a direction toward the display area, wherein the at least one branch of the reinforcing member extends in a diagonal direction inclined with respect to a direction of extension of the main body of the reinforcing member.

11. The display device of claim 1, wherein the dam unit is disposed on a same layer as that of the pixel defining layer.

12. The display device of claim 1, wherein the dam unit is disposed on a same layer as that of the passivation layer.

13. The display device of claim 1, wherein the dam unit includes a first organic insulation pattern and a second organic insulation pattern, which are sequentially laminated on the substrate in the non-display area.

14. The display device of claim 13, wherein the first organic insulation pattern is disposed on a same layer as that of the passivation layer, and the second organic insulation pattern is disposed on a same layer as that of the pixel defining layer.

15. A display device, comprising:
a substrate including a display area and a non-display area abutting the display area;
a plurality of pixels disposed within the display area, each of the plurality of pixels including a light emitting element;
an encapsulation layer, including an organic material, disposed on the plurality of pixels;
a baffle disposed in the non-display area of the substrate; and
a reinforcing member disposed in the non-display area,
wherein the baffle is covered by the encapsulation layer, the baffle includes at least one protrusion, and the at least one protrusion extends in a direction away from the display area,
wherein the reinforcing member includes a main body and at least one branch which extends in a direction toward the display area, and
wherein the at least one branch of the reinforcing member extends in a diagonal direction inclined with respect to a direction of extension of the main body of the reinforcing member.

16. The display device of claim 15, wherein:
the at least one protrusion comprises a plurality of protrusions, and
the baffle is disposed in plural and there is a cavity formed between each pair of proximate protrusions of the plurality of protrusions.

17. The display device of claim 16, further comprising a light unit configured to cast a light upon the plurality of protrusions and to thereby produce an interference pattern that indicates a boundary of the organic material of the encapsulation layer.

18. The display device of claim 16, wherein each pair of proximate protrusions of the plurality of protrusions is separated by a single spacing.

19. The display device of claim 16, wherein each pair of proximate protrusions of the plurality of protrusions is separated by a spacing that decreases or increases as a distance between the corresponding pair of proximate protrusions relative to the display area increases.

20. The display device of claim 15, further comprising:
a passivation layer disposed on the substrate; and
a pixel defining layer disposed on the passivation layer,
wherein the passivation layer and the pixel defining layer each include an organic material.

* * * * *